United States Patent
Yoshizawa (10) Patent No.: US 11,328,861 B2
(45) Date of Patent: May 10, 2022

(54) LC RESONANCE ELEMENT AND RESONANCE ELEMENT ARRAY

(71) Applicant: Noda Screen Co., Ltd., Aichi (JP)

(72) Inventor: Masamitsu Yoshizawa, Tokyo (JP)

(73) Assignee: NODA SCREEN CO., LTD., Aichi (JP)

( * ) Notice: Subject to any disclaimer, the term of this patent is extended or adjusted under 35 U.S.C. 154(b) by 881 days.

(21) Appl. No.: 16/093,250

(22) PCT Filed: Nov. 28, 2017

(86) PCT No.: PCT/JP2017/042513
§ 371 (c)(1),
(2) Date: Oct. 12, 2018

(87) PCT Pub. No.: WO2019/106705
PCT Pub. Date: Jun. 6, 2019

(65) Prior Publication Data
US 2021/0193379 A1    Jun. 24, 2021

(51) Int. Cl.
*H02H 9/00* (2006.01)
*H01F 27/40* (2006.01)
(Continued)

(52) U.S. Cl.
CPC ......... *H01F 27/40* (2013.01); *H01F 27/2804* (2013.01); *H01F 27/29* (2013.01); *H01F 41/042* (2013.01); *H01G 4/228* (2013.01); *H01G 4/306* (2013.01); *H01G 4/40* (2013.01); *H01F 2027/2809* (2013.01)

(58) Field of Classification Search
None
See application file for complete search history.

(56) References Cited

U.S. PATENT DOCUMENTS 7,667,557 B2 * 2/2010 Chen ............... H01L 24/11
                                                    333/204
7,973,246 B2   7/2011 Kuwajima
(Continued)

FOREIGN PATENT DOCUMENTS

JP    59-8054    1/1984
JP    4-213208   8/1992
(Continued)

*Primary Examiner* — Stephen W Jackson
(74) *Attorney, Agent, or Firm* — Wenderoth, Lind & Ponack, L.L.P.

(57) ABSTRACT

An LC resonance element (10) includes a dielectric film (12), a common electrode (11) formed of a thin-film conductor on a lower surface (12D) of the dielectric film, a first capacitor (C1) and a second capacitor (C2) that are connected in series via the common electrode (11) and constitute a thin-film capacitor (TC), first and second external connection terminals (14A, 14B) formed on an upper surface (12U) of the dielectric film, a thin-film conductive wire (16) constituting a thin-film inductor (TL), a first upper electrode (13A) of the first capacitor formed on the upper surface (12U), and a second upper electrode (13B) of the second capacitor formed on the upper surface (12U). The thin-film conductive wire (16) is formed in a region (R2) located on the upper surface (12U) of the dielectric film and outside the common electrode (11) in plan view.

7 Claims, 8 Drawing Sheets

(51) Int. Cl.
*H01F 27/28* (2006.01)
*H01F 27/29* (2006.01)
*H01F 41/04* (2006.01)
*H01G 4/228* (2006.01)
*H01G 4/30* (2006.01)
*H01G 4/40* (2006.01)

(56) References Cited

U.S. PATENT DOCUMENTS

| | | | |
|---|---|---|---|
| 9,153,549 B2 * | 10/2015 | Oyamada | H05K 1/141 |
| 10,149,379 B2 * | 12/2018 | Oyamada | H01L 23/49838 |
| 2007/0145523 A1 * | 6/2007 | Chow | H01L 28/60 |
| | | | 257/532 |
| 2007/0253144 A1 | 11/2007 | Kuwajima | |
| 2018/0177059 A1 | 6/2018 | Hattori | |

FOREIGN PATENT DOCUMENTS

| | | |
|---|---|---|
| JP | 10-79469 | 3/1998 |
| JP | 10-150337 | 6/1998 |
| JP | 11-121264 | 4/1999 |
| JP | 2007-300002 | 11/2007 |
| JP | 2016-039283 | 3/2016 |
| JP | 6078765 | 2/2017 |

* cited by examiner

|      | fo [Hz]   | [pF] | [H]      |
|------|-----------|------|----------|
| 10A  | 5.00E+09  | 1.28 | 7.89E−10 |
| 10B  | 4.75E+09  | 1.43 | 7.86E−10 |
| 10C  | 4.50E+09  | 1.59 | 7.85E−10 |
| 10D  | 4.25E+09  | 1.79 | 7.82E−10 |
| 10E  | 4.00E+09  | 2.04 | 7.77E−10 |
| 10F  | 3.75E+09  | 2.34 | 7.71E−10 |
| 10G  | 3.50E+09  | 2.69 | 7.69E−10 |
| 10H  | 3.25E+09  | 3.09 | 7.77E−10 |
| 10I  | 3.00E+09  | 3.61 | 7.80E−10 |
| 10J  | 2.75E+09  | 4.26 | 7.86E−10 |

FIG.10

LC RESONANCE ELEMENT AND RESONANCE ELEMENT ARRAY

TECHNICAL FIELD

The present invention relates to an LC resonance element and a resonance element array including a plurality of the LC resonance elements, and more specifically to an LC resonance element including a thin-film capacitor and a thin-film inductor.

BACKGROUND ART

Conventionally, for example, the technique disclosed in Patent Document 1 has been known as the LC resonance element including a thin-film capacitor and a thin-film inductor. Patent Document 1 discloses a technique for reducing the size of an LC resonator by integrally forming an inductance (inductor) L and a capacitance (capacitor) C on the same dielectric substrate using a thin film forming technique.

RELATED ART DOCUMENT

Patent Document

Patent Document 1: Japanese Unexamined Patent Application Publication No. 4-213208

Problem to be Solved by the Invention

With the above-described conventional technique, however, the inductor and the capacitor are formed in totally different regions on the dielectric substrate. In addition, an external electrode is not formed in any region on the dielectric substrate. Therefore, there is room for further reduction in the size of the LC resonance element.

With the above-described conventional technique, a through hole is formed in the dielectric substrate in order to form a parallel circuit of the inductor and the capacitor (see FIG. 7 of Patent Document 1). For this reason, there is a disadvantage that the structure becomes complicated.

DISCLOSURE OF THE PRESENT INVENTION

In the present description, therefore, an LC resonance element and a resonance element array which can be further reduced in size and have a simple structure are provided.

Means for Solving the Problem

An LC resonance element disclosed in the present description includes: a parallel circuit of a thin-film capacitor and a thin-film inductor; a dielectric film having an upper surface and a lower surface opposite to the upper surface; a common electrode formed of a thin-film conductor on the lower surface; a first capacitor and a second capacitor that are connected in series via the common electrode and constitute the thin-film capacitor; a first external connection terminal and a second external connection terminal that are formed on the upper surface; a thin-film conductive wire that is formed in a region located on the upper surface and outside the common electrode in plan view, constitutes the thin-film inductor, and connects the first external connection terminal and the second external connection terminal; a first upper electrode that is connected to the first external connection terminal, the first upper electrode formed in a region of the upper surface over the common electrode in plan view, the first upper electrode forming the first capacitor together with the common electrode and the dielectric film; and a second upper electrode that is connected to the second external connection terminal, the second upper electrode formed in a region of the upper surface over the common electrode in plan view, the second upper electrode forming the second capacitor together with the common electrode and the dielectric film.

According to this configuration, the thin-film capacitor includes the first capacitor and the second capacitor that are connected in series via the common electrode. With this configuration of the thin-film capacitor, the thin-film inductor is formed of the thin-film conductive wire that is formed in the region located on the upper surface and outside the common electrode in plan view. The first external connection terminal and the second external connection terminal are formed on the upper surface of the dielectric film. With such a configuration, therefore, the size of the LC resonance element is further reduced and the structure thereof is simplified.

If the thin-film inductor overlaps the common electrode in plan view, electrostatic capacitance is formed between the thin-film inductor and the common electrode, and the Q value in an LC parallel resonance circuit decreases. However, the thin-film inductor is located outside the common electrode, making it possible to avoid the decrease in the Q value.

In the LC resonance element, the thin-film conductive wire may be formed in a loop shape.

According to this configuration, the thin-film conductive wire is formed in a loop shape, and therefore a desired inductance can be easily obtained as compared with a case where the thin-film conductive wire is formed in a linear shape.

Furthermore, in the LC resonance element, the thin-film conductive wire may be formed in a loop shape along the outer periphery of the common electrode.

According to this configuration, the thin-film conductive wire is formed along the outer periphery of the common electrode, and therefore the common electrode is located within a thin-film inductor loop in plan view. As a result, the plane area of the LC resonance element can be reduced.

In the LC resonance element, the first external connection terminal and the second external connection terminal may be formed in a region located on the upper surface and outside the common electrode in plan view.

According to this configuration, the reliability of the LC resonance element associated with the external connection terminals can be improved. That is, heat and stress are applied to the external connection terminals at the time of or after connection with an external circuit. Therefore, if the common electrode is directly underneath the external connection terminals via the dielectric film, there may be a risk of, for example, short-circuiting with the common electrode and a change in capacitance value caused by the external connection terminal being peeled from the dielectric film. However, according to this configuration, such a risk can be avoided since the common electrode is not provided directly underneath the external connection terminals. In addition, since both the first external connection terminal and the second external connection terminal are formed on the upper surface of the dielectric film, the first external connection terminal and the second external connection terminal can be easily connected to the outside.

The LC resonance element may also include a first connection portion that connects the first upper electrode and the first external connection terminal, and a second connection portion that connects the second upper electrode and the second external connection terminal. The first and second upper electrodes, the first and second external connection terminals, the first and second connection portions, and the thin-film conductive wire may be integrally formed of a single thin-film conductor on the upper surface.

According to this configuration, the respective portions formed on the upper surface of the dielectric film can be easily formed through formation of a single thin film.

A resonance element array disclosed in the present description includes a plurality of any of the above-described LC resonance elements, and the LC resonance elements have the dielectric film in common.

According to this configuration, a compact resonance element array can be formed.

In the resonance element array, an area of the first upper electrode may be equal to an area of the second upper electrode in each of the LC resonance elements, and an area of the first upper electrode and the second upper electrode combined may be different among the LC resonance elements.

According to this configuration, the area of the first upper electrode and the second upper electrode combined may be different among the LC resonance elements, and therefore the capacitance of the capacitors is different among the LC resonance elements. As a result, the resonance frequency is different among the LC resonance elements. This makes it possible to select, by means of circuit switching, a plurality of filters of continuously different resonance frequencies in a communication apparatus or the like.

Advantageous Effect of the Invention

According to the LC resonance element and the resonance element array disclosed in the present description, it is possible to provide an LC resonance element and a resonance element array which can be further reduced in size and have a simple structure.

MODE FOR CARRYING OUT THE INVENTION

Embodiments will be described below with reference to FIGS. 1 to 10. In the drawings, the same reference symbols denote the same or corresponding parts.

First Embodiment

First, an LC resonance element 10 according to a first embodiment will be described with reference to FIGS. 1 to 7.

1. Configuration of LC Resonance Element

Figure 1:
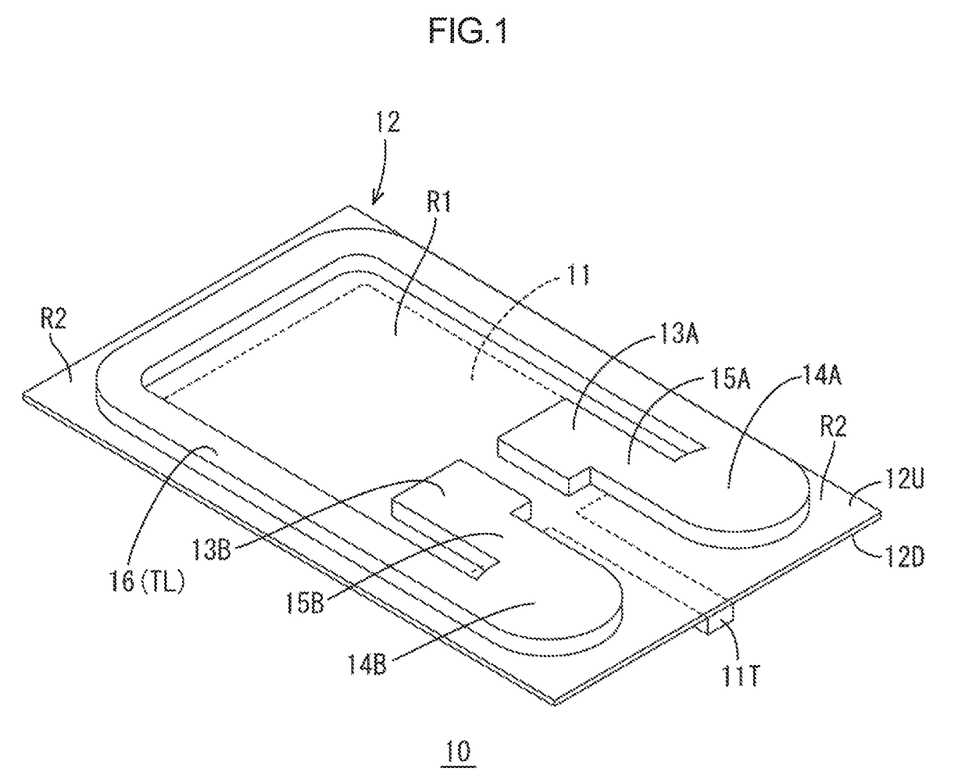
FIG. 1 is a perspective view showing an LC resonance element according to a first embodiment.
Figure 2:
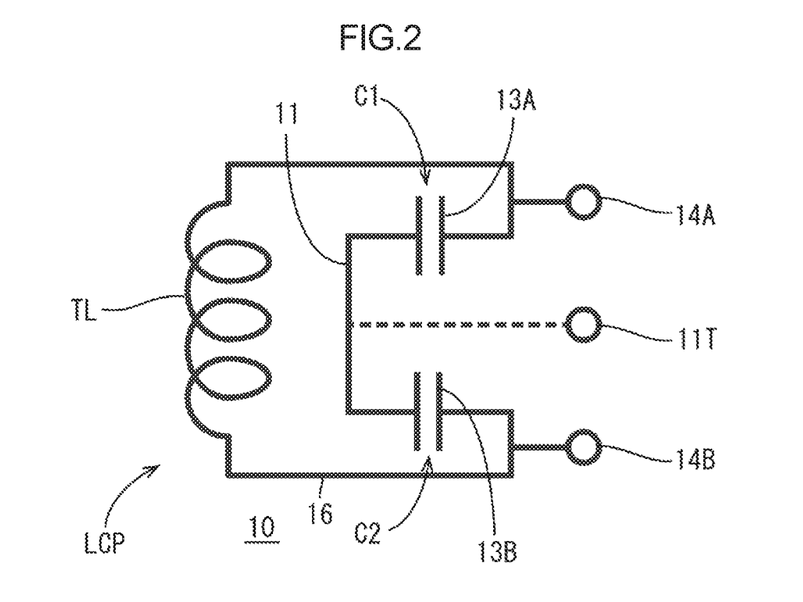
FIG. 2 is a diagram showing an equivalent circuit of the LC resonance element.

As shown in FIGS. 1 and 2, the LC resonance element 10 includes a parallel circuit PC of a thin-film capacitor TC and a thin-film inductor TL. In other words, the LC resonance element 10 is an LC parallel resonance element. The LC resonance element 10 is mainly an element for a high-frequency circuit of a several-GHz band.

The LC resonance element 10 includes a common electrode 11, a dielectric film 12, a first upper electrode 13A, a second upper electrode 13B, a first capacitor C1, a second capacitor C2, a first external connection terminal 14A, a second external connection terminal 14B, and a thin-film conductive wire 16.

The dielectric film 12 is, for example, a strontium titanate (STO) film, and has an upper surface 12U and a lower surface 12D that is on the opposite side of the upper surface 12U.

The common electrode 11 has a rectangular shape and is formed of a thin-film conductor such as a copper thin film on the lower surface 12D of the dielectric film.

The first capacitor C1 and the second capacitor C2 are connected in series via the common electrode 11 and constitute the thin-film capacitor TC of the parallel circuit PC. In other words, the thin-film capacitor TC includes the two thin-film capacitors (C1, C2) that are connected in series. That is, the capacitance of the thin-film capacitor TC is represented by $C1 \cdot C2/(C1+C2)$. Herein, C1 represents the capacitance of the first capacitor C1 while C2 represents the capacitance of the second capacitor C2.

Figure 3:
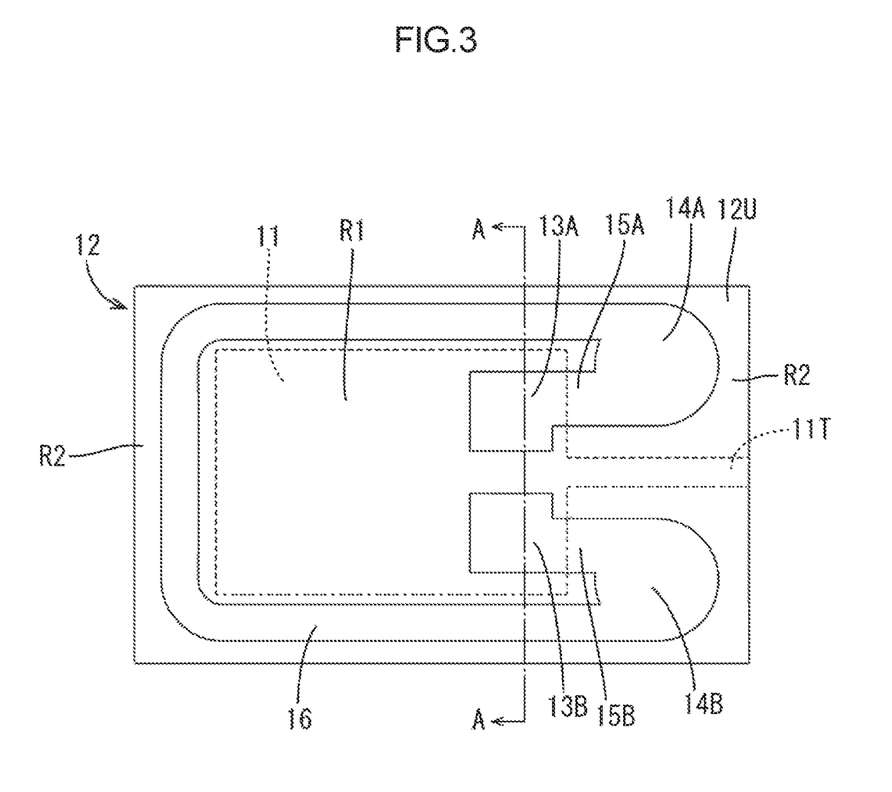
FIG. 3 is a plan view of the LC resonance element.

As shown in FIGS. 1 and 3, the first external connection terminal 14A and the second external connection terminal 14B are formed in a region R2 on the upper surface 12U of the dielectric film. The region R2 is located outside the common electrode in plan view. With this configuration, the reliability of the LC resonance element 10 associated with the external connection terminals (14A, 14B) can be improved. That is, heat and stress are applied to the external connection terminals (14A, 14B) at the time of or after connection with an external circuit. Therefore, if the common electrode 11 is directly underneath the external connection terminals via the dielectric film 12, there may be a risk of, for example, short-circuiting with the common electrode 11 and a change in capacitance value caused by the external connection terminal being peeled from the dielectric film 12. However, according to the present embodiment, such a risk can be avoided since the common electrode 11 is not provided directly underneath the external connection terminals (14A, 14B).

In addition, since both the first external connection terminal 14A and the second external connection terminal 14B are formed on the same upper surface 12U of the dielectric film, the first external connection terminal 14A and the second external connection terminal 14B can be easily connected to the outside.

As shown in FIGS. 1 and 3, the thin-film conductive wire 16 is formed in a loop shape along the outer periphery of the common electrode 11 in the region R2 located on the upper surface 12U of the dielectric film and outside the common electrode in plan view. The thin-film conductive wire 16 forms the thin-film inductor TL of the parallel circuit PC. If the thin-film inductor HL overlaps the common electrode 11 in plan view, electrostatic capacitance is normally formed between the thin-film inductor HL and the common electrode 11, and the Q value in an LC parallel resonance circuit LCP decreases. In the present embodiment, however, the thin-film inductor HL is located outside the common electrode 11, making it possible to avoid such a decrease in the Q value. In addition, since the thin-film conductive wire 16 is formed along the outer periphery of the common electrode 11 on the upper surface 12U of the dielectric film, the plane area of the LC resonance element can be reduced.

Furthermore, the thin-film conductive wire 16 connects the first external connection terminal 14A and the second external connection terminal 14B. That is, one end of the thin-film conductive wire 16 is connected to the first external connection terminal 14A, and the other end of the thin-film conductive wire 16 is connected to the second external connection terminal 14B.

The first upper electrode 13A is connected to the first external connection terminal 14A and is formed in a region R1 over the common electrode 11 in plan view, on the upper surface 12U of the dielectric film. The first upper electrode 13A forms the first capacitor C1 together with the common electrode 11 (more specifically, a portion of the common electrode 11 overlapping the first upper electrode 13A) and the dielectric film 12.

The second upper electrode 13B is connected to the second external connection terminal 14B and is formed in the region R1 over the common electrode 11 in plan view, on the upper surface 12U of the dielectric film. The second upper electrode 13B forms the second capacitor together with the common electrode 11 (more specifically, a portion of the common electrode 11 overlapping the second upper electrode 13B) and the dielectric film 12. In the present embodiment, the area of the first upper electrode 13A is equal to that of the second upper electrode 13B. Therefore, the capacitance of the first capacitor C1 is equal to that of the second capacitor C2. Note that the present invention is not limited to this example, and the areas of the first upper electrode 13A and the second upper electrode 13B may be different.

The LC resonance element 10 also includes a first connection portion 15A and a second connection portion 15B. The first connection portion 15A connects the first upper electrode 13A and the first external connection terminal 14A. The second connection portion 15B connects the second upper electrode 13B and the second external connection terminal 14B. The first and second upper electrodes (13A, 13B), the first and second external connection terminals (14A, 14B), the first and second connection portions (15A, 15B), and the thin-film conductive wire 16 are formed of the same thin-film conductor on the upper surface 12U of the dielectric film. Therefore, the respective portions formed on the upper surface 12U of the dielectric film can be formed through formation of a single thin film. This reduces the number of steps of manufacturing the LC resonance element 10.

Note that the present invention is not limited to this example, and the respective portions formed on the upper surface 12U of the dielectric film do not have to be integrally formed of the same thin-film conductor on the upper surface 12U of the dielectric film. For example, the thin-film conductive wire 16 may be formed of a thin-film conductor different from the thin-film conductor forming the other portions.

An inspection terminal 11T for element inspection that is connected to the common electrode 11 is shown in FIG. 1 and the like. The inspection terminal 11T is removed after the inspection is finished. That is, the inspection terminal 11T is not included in the finished product of the LC resonance element 10.

Figure 5:
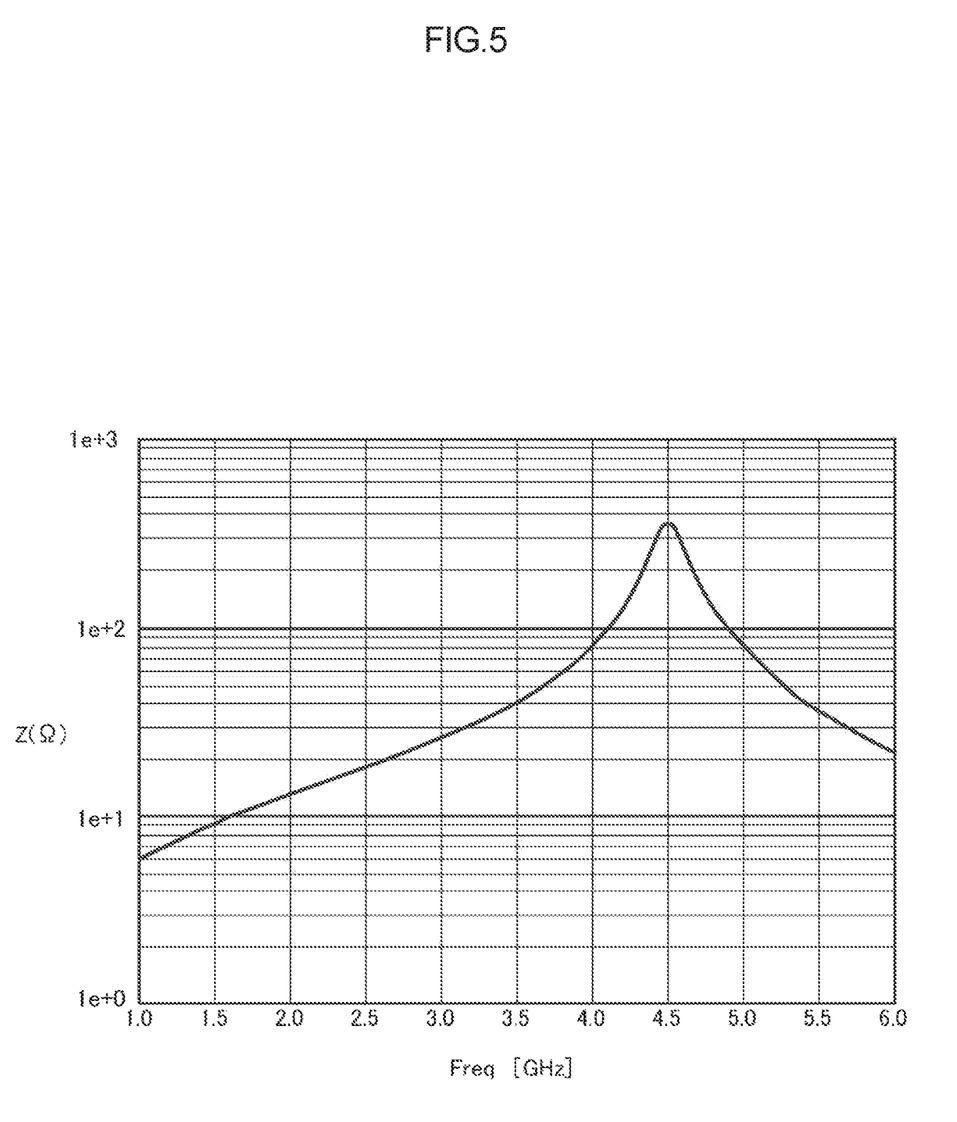
FIG. 5 is a graph showing frequency-impedance characteristics of the LC resonance element.

FIG. 5 shows the frequency-impedance characteristics of the LC resonance element 10 having such a configuration. The results drawn in the graph of FIG. 5 are calculated by a SPICE simulator on the basis of numerical values of LC data extracted by an electromagnetic field simulation using the finite element method.

2. Method for Manufacturing LC Resonance Element

Next, the outline of the method for manufacturing the LC resonance element 10 will be described with reference to FIGS. 6 and 7.

Figure 6:
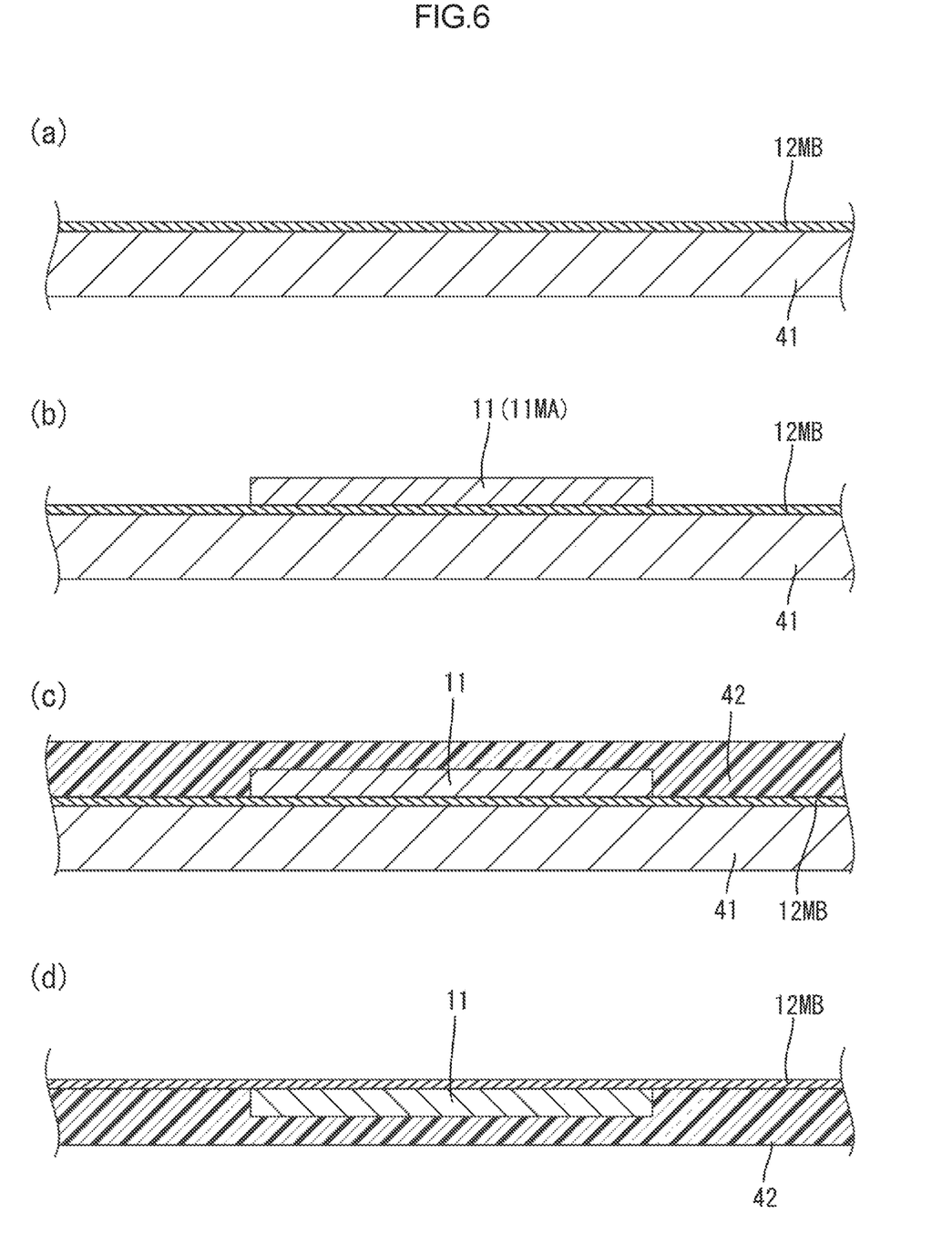
FIG. 6 is a cross-sectional view showing steps of manufacturing the LC resonance element.

In the manufacturing method, first, as shown in FIG. 6(a), an STO film 21MB is formed on the surface of a dry-cleaned substrate 41 by the aerosol (AS) CVD method, for example. The STO film 11MB has a film thickness of, for example, 0.1 µm to 0.4 µm. The STO film 12MB is to be the dielectric film 12 of the thin-film capacitors (C1, C2). The substrate 41 is made of an aluminum foil in the present embodiment. A metal foil as the substrate is not limited to the aluminum foil, and may be a metal foil such as a copper or nickel foil. In addition, the dielectric film is not limited to the STO film 11MB.

Next, as shown in FIG. 6(b), a metal thin film 11MA to be the common electrode 11 of the thin-film capacitors (C1, C2) is formed on the STO film 12MB. The metal thin film 11MA is made of, for example, a copper (Cu) thin film. The Cu thin film is formed, for example, by the vapor deposition method. The metal thin film 13MA has a film thickness of, for example, 2 µm or less.

Herein, the metal thin film 11MA is patterned by a technique such as photolithography to form the common electrode 11.

Next, as shown in FIG. 6(c), a resin film 42 as a holding material is attached onto the metal thin film 11MA. Next, as shown in FIG. 6(d), the aluminum substrate 41 is removed, for example, by etching to expose a surface of the STO film 12MB opposite to the surface on which the metal thin film 11MA is formed. FIG. 6(d) and the following drawings are obtained by inverting FIG. 6(c) vertically.

Figure 7:
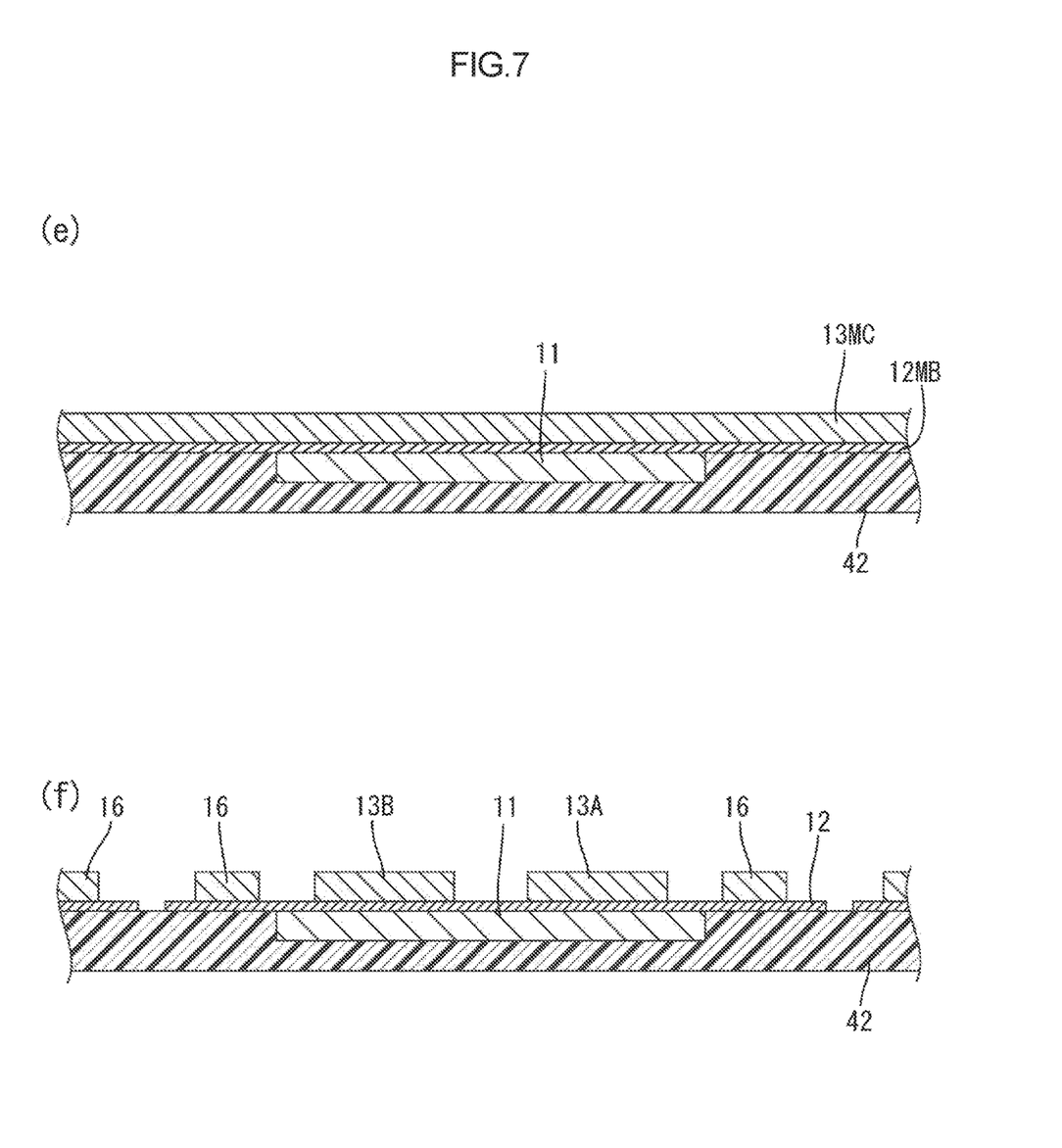
FIG. 7 is a cross-sectional view showing steps of manufacturing the LC resonance element.

Next, as shown in FIG. 7(e), a metal thin film 13MC is formed on the exposed surface of the STO film 12MB. The metal thin film 13MC is to be the upper electrodes (13A, 13B), the first external connection terminal 14A, the second external connection terminal 14B, the thin-film conductive wire 16 and the like of the thin-film capacitors (C1, C2). Like the metal thin film 11MA, the metal thin film 13MC is made of, for example, a copper (Cu) thin film. The Cu thin film is formed, for example, by the vapor deposition method. The metal thin film 13MC has a film thickness of, for example, 2 µm or less.

Next, as shown in FIG. 7(f), the metal thin film 13MC and the STO film 12MB are patterned to form the upper electrodes (13A, 13B), the first external connection terminal 14A, the second external connection terminal 14B, the thin-film conductive wire 16 and the like, and the STO film 12MB is patterned to form the dielectric film 12. In this manner, the thin-film capacitors (C1, C2) are formed.

Figure 4:
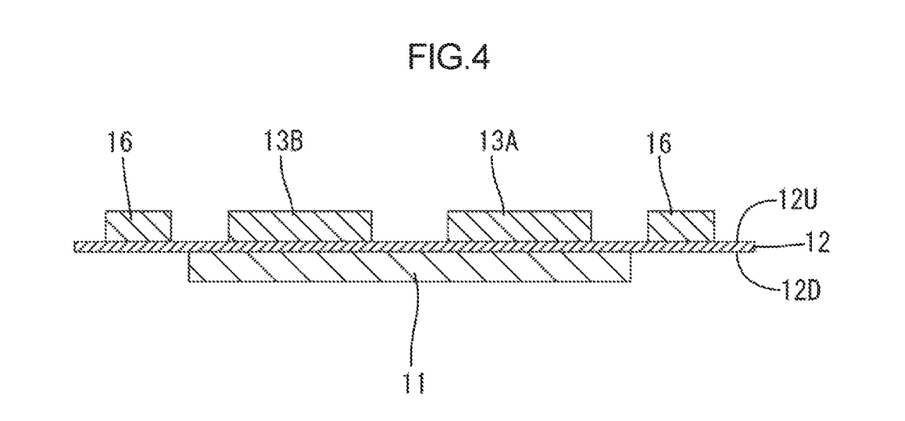
FIG. 4 is a cross-sectional view taken along line A-A in FIG. 3.

Next, a solder resist (not shown) is formed on the dielectric film 12, and portions of the solder resist corresponding to the first external connection terminal 14A and the second external connection terminal 14B are opened. Next, the resin film 42 is removed by being cut with a dicer to a required size, whereby the LC resonance element 10 as shown in FIGS. 1 and 4 is formed. The resin film 42 is removed at the time of mounting in order to protect the element.

3. Effect of First Embodiment

As described above, the thin-film capacitor TC includes the first capacitor C1 and the second capacitor C2 that are connected in series via the common electrode 11. With the configuration of the thin-film capacitor TC in which the two capacitors (C1, C2) are connected in series as described above, the thin-film inductor TL (16) can be formed by the thin-film conductive wire 16 located on the upper surface 12U of the dielectric film. The thin-film conductive wire 16 is formed in a loop shape along the outer periphery of the common electrode 11 in the region R2 that is located outside the common electrode in plan view. That is, the common electrode 11 can be located within the thin-film inductor loop in plan view.

With the configuration of the thin-film capacitor TC and the arrangement of the common electrode 11 and the thin-film inductor loop, the first upper electrode 13A and the second upper electrode 13B can be formed within the thin-film inductor loop on the upper surface 12U of the dielectric film and in the region R1 over the common electrode 11 in plan view.

The first external connection terminal 14A and the second external connection terminal 14B are formed on the upper surface 12U of the dielectric film.

Therefore, with the above arrangement of the respective portions, the size of the LC resonance element 10 can be further reduced, and the structure can be simplified without requiring formation of vias or the like in the dielectric film 12.

Second Embodiment

Next, a resonance element array 20 according to a second embodiment will be described with reference to FIGS. 8 to 10.

Figure 8:
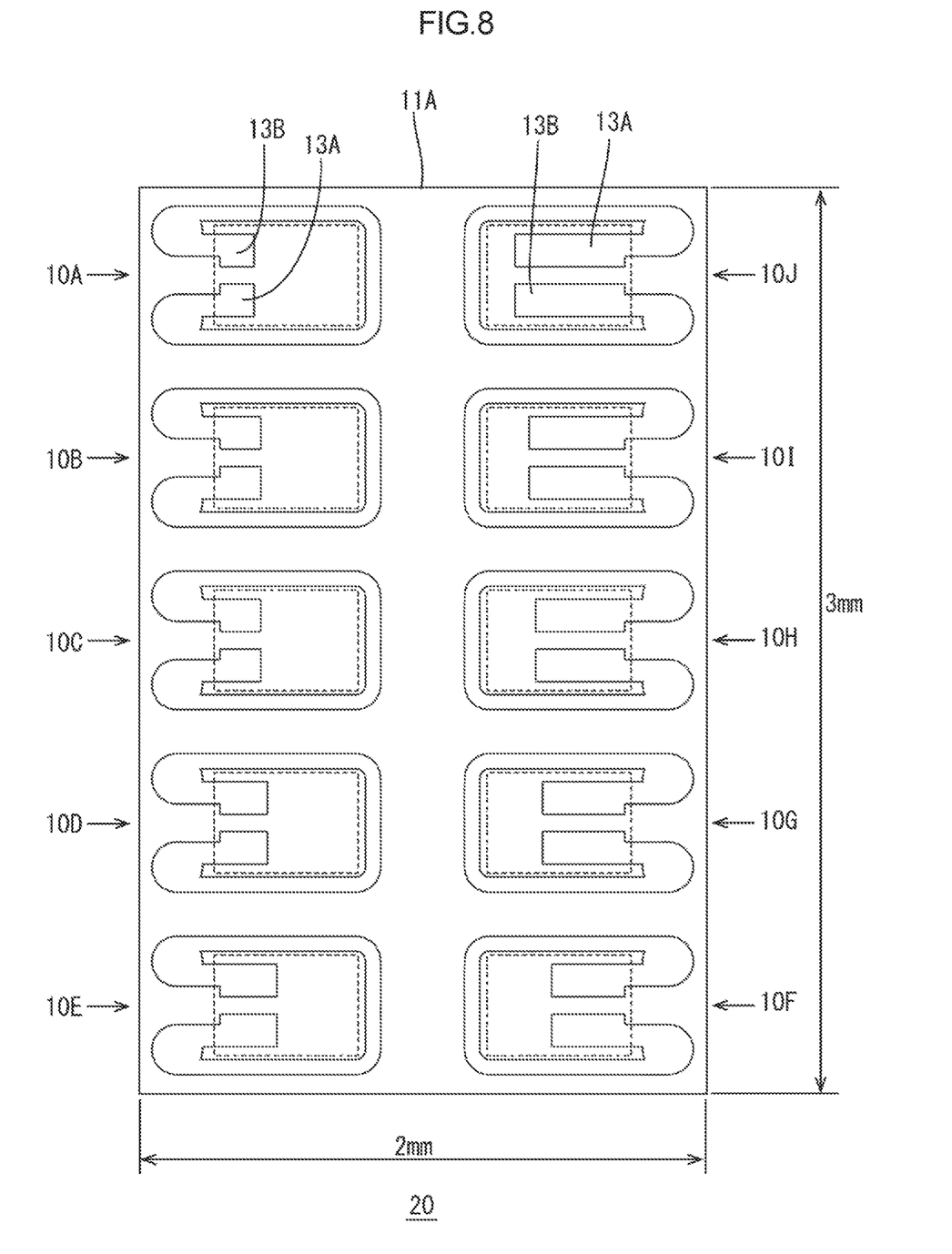
FIG. 8 is a plan view showing a resonance element array according to a second embodiment.

As shown in FIG. 8, the resonance element array 20 includes a plurality of (ten in the present embodiment) LC resonance elements (10A to 10J) described in the first embodiment, and has a rectangular shape of approximately 2 mm×3 mm. In the resonance element array 20, the LC resonance elements (10A to 10J) have a dielectric film 12A in common. With this configuration, the compact resonance element array 20 can be formed.

In each of the LC resonance elements (10A to 10J), the area of a first upper electrode 13A is equal to that of a second upper electrode 13B. Meanwhile, the area of the first upper electrode 13A and the second upper electrode 13B combined is different among the LC resonance elements (10A to 10J). In the present embodiment, as shown in FIG. 8, the area of the first upper electrode 13A and the second upper electrode 13B combined increases in order from the LC resonance element 10A to the LC resonance element 10J.

In the resonance element array 20, the area of the first upper electrode 13A and the second upper electrode 13B combined is different among the LC resonance elements (10A to 10J) as described above. Therefore, the capacitance of capacitors (C1, C2), that is, a thin-film capacitor TC, is different among the LC resonance elements (10A to 10J). As a result, the resonance frequency is different among the LC resonance elements (10A to 10J). This makes it possible to select, by means of circuit switching, a plurality of filters of continuously different resonance frequencies in a communication apparatus or the like.

Figure 9:
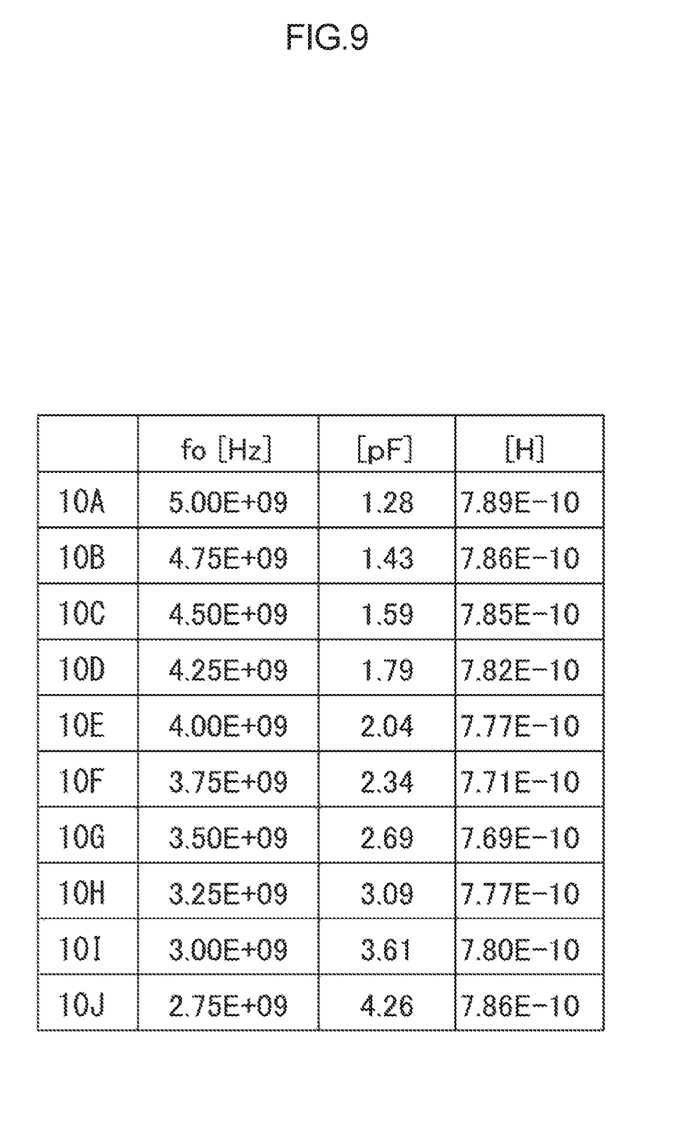
FIG. 9 is a table showing characteristics of each LC resonance element in the resonance element array.
Figure 10:
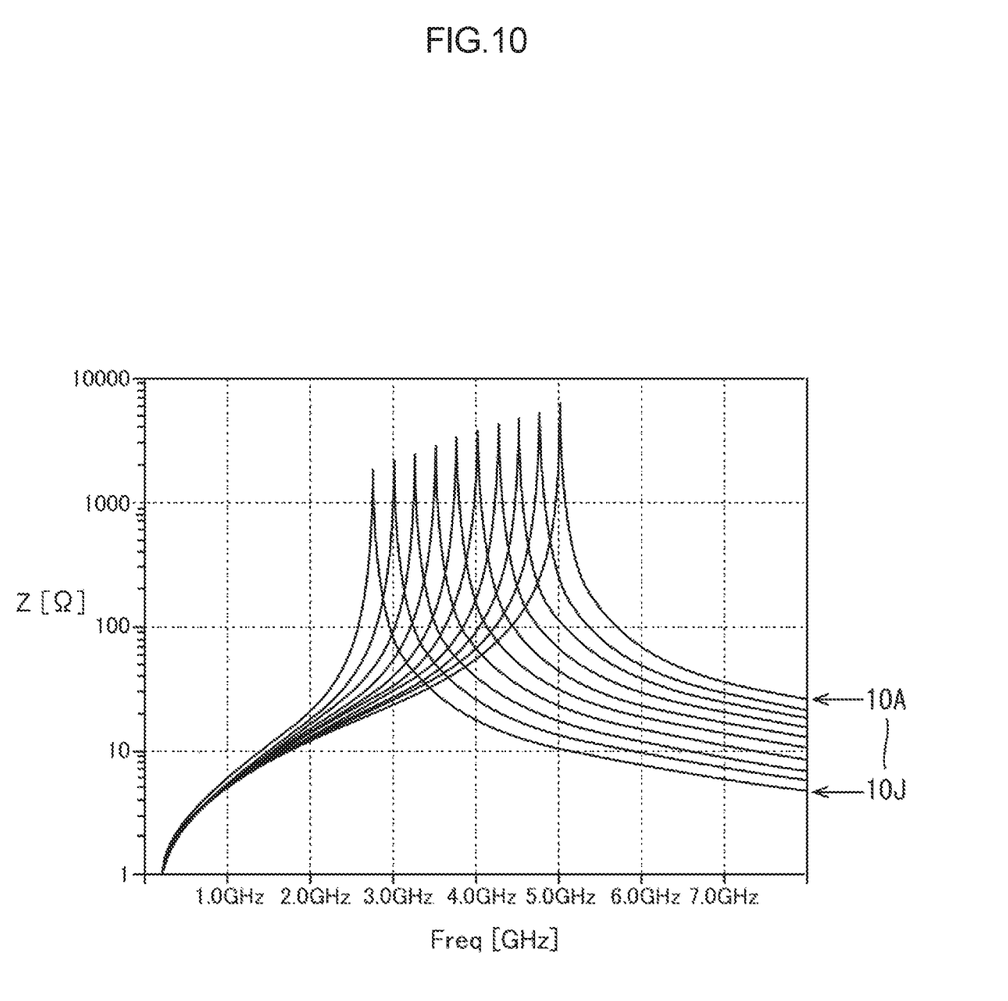
FIG. 10 is a graph showing frequency-impedance characteristics of each LC resonance element.

In this case, the numerical value table of FIG. 9 shows the results of LC data extracted by the electromagnetic field simulation using the finite element method. The numerical value table of FIG. 9 shows the resonance frequency fo [Hz], the capacitance [pF] of the thin-film capacitor TC, and the inductance [H] of a thin-film inductor TL in each of the LC resonance elements (10A to 10J). The results calculated by the SPICE simulator on the basis of the numerical values in this numerical value table are shown in the graph of FIG. 10.

Other Embodiments

The present invention is not limited to the above description and the embodiments described with reference to the drawings, and various aspects such as the following are also included in the technical scope of the present invention.

(1) In the second embodiment, the area of the first upper electrode 13A and the second upper electrode 13B combined is different among the LC resonance elements (10A to 10J), but the present invention is not limited to this example. For example, the area of the first upper electrode 13A and the second upper electrode 13B combined may be equal among the LC resonance elements (10A to 10J). Alternatively, the area of the first upper electrode 13A and the second upper electrode 13B combined may be different among several LC resonance elements, in which case the area of the first upper electrode 13A and the second upper electrode 13B combined may be equal among the remaining several LC resonance elements.

(2) In the above embodiments, the area of the first upper electrode 13A is equal to that of the second upper electrode 13B in any one LC resonance element, but the present invention is not limited to this example. The area of the first upper electrode 13A may be different from that of the second upper electrode 13B in one LC resonance element.

(3) In the above embodiments, the thin-film conductive wire 16 is formed in a loop shape along the outer periphery of the common electrode 11, but the present invention is not limited to the example in which the thin-film conductive wire 16 is along the outer periphery of the common electrode 11. The thin-film conductive wire 16 just needs to be formed in a loop shape in the region R2 located on the upper surface 12U and outside the common electrode 11 in plan view. Furthermore, the thin-film conductive wire 16 does not necessarily have to be formed in a loop shape. For example, in the region R2 on the side opposite to the common electrode side in plan view, the thin-film conductive wire 16 may be formed in a linear shape connecting the external electrode terminals (14A, 14B) or may be formed in a shape of a triangular wave.

(4) In the above embodiments, the first external connection terminal 14A and the second external connection terminal 14B are formed in the region R2 located on the upper surface and outside the common electrode in plan view, but the present invention is not limited to this example. The first external connection terminal 14A and the second external connection terminal 14B just need to be formed on the upper surface 12U. For example, the first external connection terminal 14A and the second external connection terminal 14B may be formed on the first upper electrode 13A and the second upper electrode 13B, respectively.

(5) In the above embodiments, the STO film 12 is formed by the ASCVD method to form the dielectric film of the thin-film capacitor TC, but the dielectric film is not limited to the one formed in this manner. The composition of a dielectric material may be, for example, ZnO, BTO, or BST, and the film formation method may be sputtering, spin coating, or vapor deposition.

EXPLANATION OF SYMBOLS 10, 10A to 10J: LC resonance element
11: Common electrode 12, 12A: STO film (Dielectric film)
12D: Lower surface of STO film
12U: Upper surface of STO film
13A: First upper electrode
13B: Second upper electrode
14A: First external connection terminal
14B: Second external connection terminal
15A: First connection portion
15B: Second connection portion
16: Thin-film conductive wire
20: Resonance element array
C1: First capacitor (Thin-film capacitor)
C2: Second capacitor (Thin-film capacitor)
LCP: Parallel circuit
R1: Region on upper surface of STO film, over common electrode in plan view
R2: Region on upper surface of STO film, located outside common electrode in plan view
TC: Thin-film capacitor
TL: Thin-film inductor

The invention claimed is:

1. An LC resonance element comprising:
    a parallel circuit of a thin-film capacitor and a thin-film inductor;
    a dielectric film having an upper surface and a lower surface opposite to the upper surface;
    a common electrode formed of a thin-film conductor on the lower surface;
    a first capacitor and a second capacitor that are connected in series via the common electrode and constitute the thin-film capacitor;
    a first external connection terminal and a second external connection terminal that are formed on the upper surface;
    a thin-film conductive wire that is formed in a region located on the upper surface and outside the common electrode in plan view, constitutes the thin-film inductor, and connects the first external connection terminal and the second external connection terminal;
    a first upper electrode that is connected to the first external connection terminal, the first upper electrode formed in a region of the upper surface over the common electrode in plan view, the first upper electrode forming the first capacitor together with the common electrode and the dielectric film; and
    a second upper electrode that is connected to the second external connection terminal, the second upper electrode formed in a region of the upper surface over the common electrode in plan view, the second upper electrode forming the second capacitor together with the common electrode and the dielectric film.

2. The LC resonance element according to claim 1, wherein the thin-film conductive wire is formed in a loop shape.

3. The LC resonance element according to claim 1, wherein the thin-film conductive wire is formed in a loop shape along an outer periphery of the common electrode.

4. The LC resonance element according to claim 1, wherein the first external connection terminal and the second external connection terminal are formed in a region located on the upper surface and outside the common electrode in plan view.

5. The LC resonance element according to claim 1, further comprising:
    a first connection portion that connects the first upper electrode and the first external connection terminal; and
    a second connection portion that connects the second upper electrode and the second external connection terminal,
    wherein the first and second upper electrodes, the first and second external connection terminals, the first and second connection portions, and the thin-film conductive wire are integrally formed of a single thin-film conductor on the upper surface.

6. A resonance element array comprising:
    a plurality of the LC resonance elements according to claim 1,
    wherein the LC resonance elements have the dielectric film in common.

7. A resonance element array comprising:
    a plurality of the LC resonance elements according to claim 1, wherein
    the LC resonance elements have the dielectric film in common,
    an area of the first upper electrode is equal to an area of the second upper electrode in each of the LC resonance elements, and
    an area of the first upper electrode and the second upper electrode combined is different among the LC resonance elements.

* * * * *